United States Patent
Gao (10) Patent No.: US 11,796,260 B2
(45) Date of Patent: *Oct. 24, 2023

(54) SYSTEM FOR THERMAL MANAGEMENT IN MULTIPLE OPERATING CONDITIONS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 471 days.

This patent is subject to a terminal disclaimer.

(21) Appl. No.: 16/849,651

(22) Filed: Apr. 15, 2020

(65) Prior Publication Data

US 2021/0325126 A1 Oct. 21, 2021

(51) Int. Cl.
*F25B 29/00* (2006.01)
*F28D 20/02* (2006.01)
*F28D 20/00* (2006.01)

(52) U.S. Cl.
CPC .... *F28D 20/028* (2013.01); *F28D 2020/0078* (2013.01)

(58) Field of Classification Search
CPC .... F28F 3/02; F28F 3/12; F24H 1/121; H05K 7/20; H01L 23/4735; H05B 3/20; F25B 29/00
See application file for complete search history.

(56) References Cited

U.S. PATENT DOCUMENTS

| | | | |
|---|---|---|---|
| 8,151,872 B2* | 4/2012 | Di Stefano | G05D 23/1931 165/80.4 |
| 9,984,908 B2* | 5/2018 | Kobayashi | G05D 23/1934 |
| 10,553,463 B2* | 2/2020 | Kobayashi | H01L 21/67248 |
| 11,428,479 B2* | 8/2022 | Gao | G05D 23/19 |
| 11,470,740 B2* | 10/2022 | Chehade | H05K 7/20254 |
| 2005/0151553 A1* | 7/2005 | Kabbani | G01R 31/2891 324/750.08 |
| 2011/0056927 A1* | 3/2011 | Wu | H05B 3/50 156/64 |
| 2014/0158341 A1* | 6/2014 | Campbell | H05K 7/20781 165/287 |
| 2014/0299174 A1* | 10/2014 | Yu | F24T 10/30 136/246 |

(Continued)

*Primary Examiner* — Claire E Rojohn, III
(74) *Attorney, Agent, or Firm* — WOMBLE BOND DICKINSON (US) LLP (57) ABSTRACT

Embodiments are disclosed of an apparatus including a cooling loop and a heating loop. The cooling loop includes a temperature control plate having a fluid inlet and a fluid outlet, the temperature control plate being adapted to be thermally coupled to one or more heat-generating electronic components. An inlet control is fluidly coupled to the fluid inlet of the temperature control plate and an outlet control fluidly coupled to the fluid outlet of the temperature control plate. A cooling fluid source is fluidly coupled the inlet control and a cooling fluid return fluidly coupled to the outlet control. The heating loop contains less fluid than the cooling loop and includes a heating fluid source fluidly coupled the inlet control and a heating fluid return fluidly coupled to the outlet control. A pump can circulate heating fluid through at least the heating fluid supply, the temperature control plate, and the heating fluid return.

15 Claims, 9 Drawing Sheets

(56) References Cited

U.S. PATENT DOCUMENTS

| 2015/0059360 | A1* | 3/2015 | Lin | F25B 21/02 |
| | | | | 165/104.31 |
| 2020/0275582 | A1* | 8/2020 | Wu | H05K 7/20218 |
| 2021/0325126 | A1* | 10/2021 | Gao | H01L 23/34 |
| 2021/0325128 | A1* | 10/2021 | Gao | F28F 23/02 |

* cited by examiner

SYSTEM FOR THERMAL MANAGEMENT IN MULTIPLE OPERATING CONDITIONS

TECHNICAL FIELD

The disclosed embodiments relate generally to systems for temperature control of electronic equipment and in particular, but not exclusively, to a system for temperature control in multiple operating conditions.

BACKGROUND

Much modern electronic equipment operates in predictable and steady temperature conditions. In data centers, for instance, the ambient temperature is very tightly controlled so that all the servers, routers, edge computing servers, etc., within the data center operate in steady, known temperature conditions. In homes the temperature is less tightly controlled but typically does not vary widely, so that even home electronics operate within a larger but still tolerable temperature range. In both these environments, the ambient temperature is such that electronic equipment usually needs only cooling, not heating.

But there are applications in which electronic equipment operates in uncontrolled temperature conditions where the temperature can vary widely. Electronics that operate outdoors are an example. Depending on the location and season, they can be forced to operate in ambient temperatures ranging from below freezing to very hot. Because electronics can have trouble starting up in very cold conditions and operating in very hot conditions, these applications can require both heating and cooling. Previous temperature control systems have typically provided heating or cooling, but not both. Some systems exist that use an electrical heater in a cooling loop, but these systems might not be applicable for some kinds of electronics and, moreover, these systems are not easy to control and have relatively low efficiency, and requires large space.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIGS. 2A-2B are cross-sectional views of an embodiment of a heating plate that can be used in embodiments of cooling systems like the ones shown in FIGS. 1B and 3B.

DETAILED DESCRIPTION

Embodiments are described of systems for temperature control of electronic components. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments.

The disclosed embodiments are of a heat transfer system for electronics. The system includes two loops—one for cooling and one for heating. When heating is needed the heating loop is used as a bypass loop of the cooling loop. Two different system embodiments and an innovative heat plate design are described. The disclosed embodiments enable proper thermal management for the processors or electronics running under different temperatures, seasons, and locations.

Figure 1A:
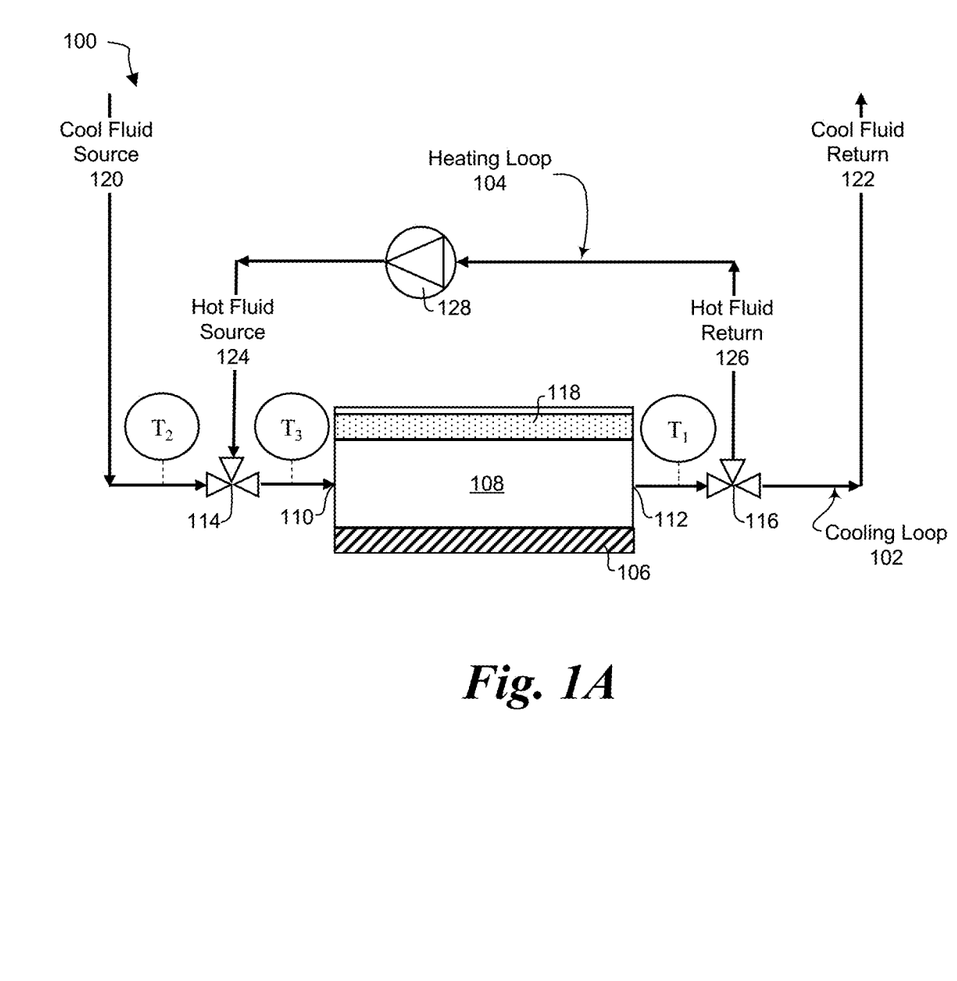
FIGS. 1A-1B are schematics of embodiments of temperature control systems with open-loop cooling.

FIG. 1A illustrates an embodiment of a temperature control system 100. System 100 includes a cooling loop 102 and a heating loop 104, both of which are fluidly coupled to a temperature control plate 108 so that they can be used to control the temperature of one more heat-generating electronics components 106. In various modes of operation, cooling loop 102 can operate alone, heating loop 104 can operate alone, or cooling loop 102 and heating loop 104 can operate simultaneously to control the temperature of electronic components 106 by heating, cooling, or a combination of the two.

A temperature control plate 108 is thermally coupled to electronic components 106, so that heat can be exchanged between the electronic components and a working fluid flowing through the temperature control plate. The heat exchange can be in either direction—from electronic components 106 into the working fluid, or from the working fluid into the electronic components—depending on whether system 100 is cooling or heating electronic components 106. Temperature control plate 108 includes a fluid inlet 110 and a fluid outlet 112. An inlet control 114 is fluidly coupled to fluid inlet 110 and an outlet control 116 is fluidly coupled to outlet 112. As used herein, two elements are "fluidly coupled" if they are coupled to each other, directly or indirectly, in such a way that a fluid can flow between them in one or both directions. In the illustrated embodiment inlet control 114 and outlet control 116 are both three-way valves, but in other embodiments they can be other types of controls. For instance, in other embodiments inlet control 114 and outlet control 116 can be combinations of two-way valves. In still other embodiments, inlet control 114 and outlet control 116 need not be the same kind of control. In most of the scenarios, inlet control 114 and outlet control 116 are at the same opening status. Still further embodiments can omit one of the two controls 114 and 116.

Cooling loop 102 is an open loop fluidly coupled to temperature control plate 108. A cool fluid source 120 is fluidly coupled to inlet control 114 and a cool fluid return 122 is fluidly coupled to outlet control 116, so that the inlet and outlet controls regulate the flow of working fluid from the cooling loop through temperature control plate 108.

Heating loop 104 is similarly coupled to temperature control plate 108 through inlet control 114 and outlet control 116, so that the inlet and outlet controls also regulate the flow of working fluid from the heating loop through temperature control plate 108. A hot fluid source 124 is fluidly coupled to inlet control 114 and a hot fluid return 126 is fluidly coupled to outlet control 116. A pump 128 is fluidly coupled into heating loop 104 to circulate the working fluid through this loop. Temperature control plate 108 includes a heater 118 to heat working fluid flowing through the temperature control plate. Heating loop 104, then, uses heater 118, as well as heat generated by electronic components 106 themselves, to heat the working fluid flowing through the heating loop. By selectively configuring inlet control 114 and outlet control 116, cool working fluid, hot working fluid, or a mixture of the two, can be directed through temperature control plate 108. Heating loop 104 and cooling loop 102 are therefore not completely separate, but rather are fluidly coupled to each other via inlet control 114, outlet control 116, and temperature control plate 108. Put differently, in system 100 temperature control plate 108 is part of both the heating loop and the cooling loop. As a result of their shared coupling to temperature control plate 108, the cooling loop and heating loop circulate the same working fluid.

Heating loop 104 is substantially shorter than cooling loop 102 so that it can quickly heat electronic components 106 when needed. Designing the heating loop as a short bypass loop allows working fluid in the loop to heat quickly since the heat that can be generated and introduced to the loop is limited to a certain period of time. By using heat generated by the electronics 106 as much as possible, the working fluid in the loop can also be heated much more quickly. Since the heating loop is a much shorter loop compared to the cooling loop, there is less working fluid in the heating loop and the fluid within the heating loop can be heated up faster given the limited amount of heat provided.

Temperature sensors can be positioned in various places in system 100 to allow the system's performance to be monitored. The illustrated embodiment includes three temperature sensors T1-T3:

T1 is positioned downstream of outlet 112 to measure the temperature of working fluid exiting temperature control plate 108. In the illustrated embodiment sensor T1 is positioned between outlet 112 and outlet control 116, but in other embodiments T1 could be positioned differently, for instance downstream of outlet control 116 in cool fluid return 122 or hot fluid return 126.

T2 is positioned in cool fluid source 120 upstream of inlet control 114 to measure the temperature of the cool working fluid.

T3 is positioned just upstream of inlet 110 to measure the temperature of working fluid entering temperature control plate 108.

Other embodiments of system 100 can have more or less temperature sensors than shown. When heating loop 104 is not operating, or if inlet control 114 and outlet control 116 are set to stop flow through heating loop 104, then temperatures T2 and T3 will be the same or close to the same. But when heating loop 104 is operating exclusively (i.e., inlet control 114 and outlet control 116 are set to only allow flow from heating loop 104 into temperature control plate 108), or when cooling loop 102 and heating loop 104 are operating simultaneously (i.e., inlet control 114 and outlet control 116 are set to allow flow from both cooling loop 102 and heating loop 104 into temperature control plate 108), T3 will generally be greater than T2.

In operation, system 100 can operate in at least three modes: cooling mode, heating mode, and mixed mode.

Mode 1: cooling mode, cooling loop is recirculating for cooling;

Mode 2: heating mode, only heating loop is recirculating for heating, the heat can be from either heater 118, electronic components 106 or both;

Mode 3: mixed mode this is a transition mode, in mixing mode, the purpose is to use the heat generated in the heating loop to heat up the cooling loop and adjust the cooling loop to a proper temperature, the heat source is mainly from 106. The design aims to save power, so heater 118 is turned off during transition mode. Another purpose is to eliminate the impact of cooling fluid when they're at relative low temperatures.

Cooling mode can be implemented by the cooling loop operating alone, or by the cooling loop and heating loop operating together but with heater 118 turned off. Heating mode is invoked, for instance, in situations where electronics 106 must be started in very cold conditions. In heating mode, the inlet and outlet controls are set to form a closed heating loop, meaning that no working fluid circulates in cooling loop 102. Once the fluid in the heating loop is heated to certain temperature, the inlet and outlet controls can be adjusted to mixed mode, where it mixes working fluid from heating loop and cooling loop. In this mode, the system is operated to ensure proper thermal conditions of the electronic components as well as to adjust to an optimal operating condition. When both loops are working, the system can be adjusted and controlled to an optimal heat transfer equilibrium of the system. Whether in heating mode or mixed mode, heating can be implemented various ways. The working fluid can be heated by electronic components 106 only, by heater 118 only, or by a combination of electronic components 106 and heater 118.

Figure 1B:
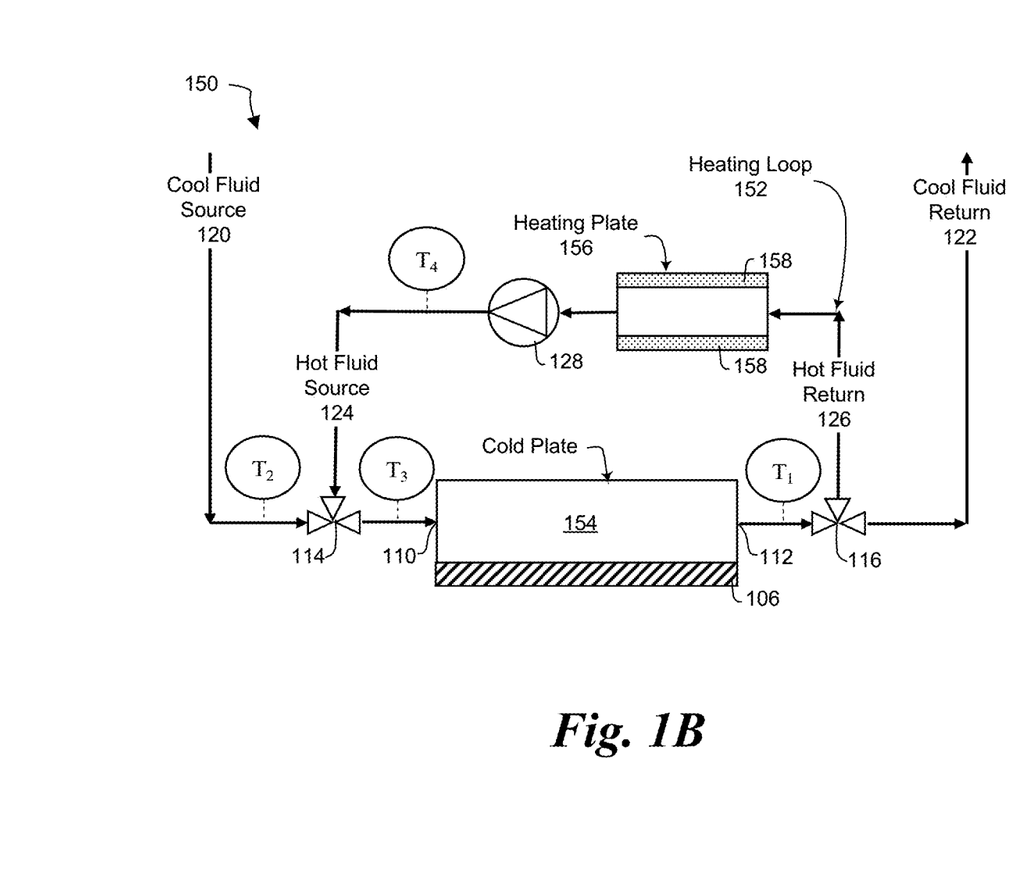

FIG. 1B illustrates an embodiment of a temperature control system 150. System 150 is in most respects similar to system 100. The primary difference between systems 150 and 100 is in where the working fluid is heated in the heating loop.

System 150 includes a cold plate 154 thermally coupled to heat-generating electronics 106. Cold plate 154 is in most respects similar to temperature control plate 108: it includes a fluid inlet 110 and a fluid outlet 112, with an inlet control 114 fluidly coupled to fluid inlet 110 and an outlet control 116 fluidly coupled to outlet 112. Cold plate 154 allows heat provided by the heat-generating electronic components 106 themselves to heat the working fluid flowing through the cold plate. But unlike temperature control plate 108, cold plate 154 includes no separate internal heater to heat the working fluid.

Cooling loop 102 is substantially the same in system 150 as it is in system 100: it is an open loop fluidly coupled to cold plate 154. A cool fluid source 120 is fluidly coupled to inlet control 114 and a cool fluid return 122 is fluidly coupled to outlet control 116, so that the inlet and outlet controls regulate the flow of cool working fluid through cold plate 154.

Heating loop 152 is different from heating loop 104. As in heating loop 104, a hot fluid source 124 is fluidly coupled to inlet control 114, a hot fluid return 126 is fluidly coupled to outlet control 116, and a pump 128 is fluidly coupled into heating loop 104 to circulate the working fluid through this loop. Unlike heating loop 104, heating loop 152 includes a heating plate 156, separate from cold plate 154 and positioned elsewhere in the heating loop, to heat the working fluid flowing through this loop. Heating plate 156 includes one or more heaters 158 to heat the working fluid. An embodiment of a heating plate is shown in FIGS. 2A-2B and described below.

To allow the system's performance to be monitored, system 150 includes the same temperature sensors T1-T3 in the same locations as in system 100. But because most of the heating now happens at heating plate 156 instead of at cold plate 154, system 150 includes an additional temperature sensor T4 downstream of the heating plate to monitor the temperature of fluid exiting the heating plate. In the illustrated embodiment temperature sensor T4 is downstream of pump 128, but in other embodiments it can be positioned at the outlet of the heating plate.

Despite their differences, systems 150 and 100 operate similarly and have the same modes of operation. By selectively configuring inlet control 114 and outlet control 116, cool working fluid, hot working fluid, or a mixture of the two, can be directed through cold plate 154 to regulate the temperature of electronics 106.

Figure 2A:
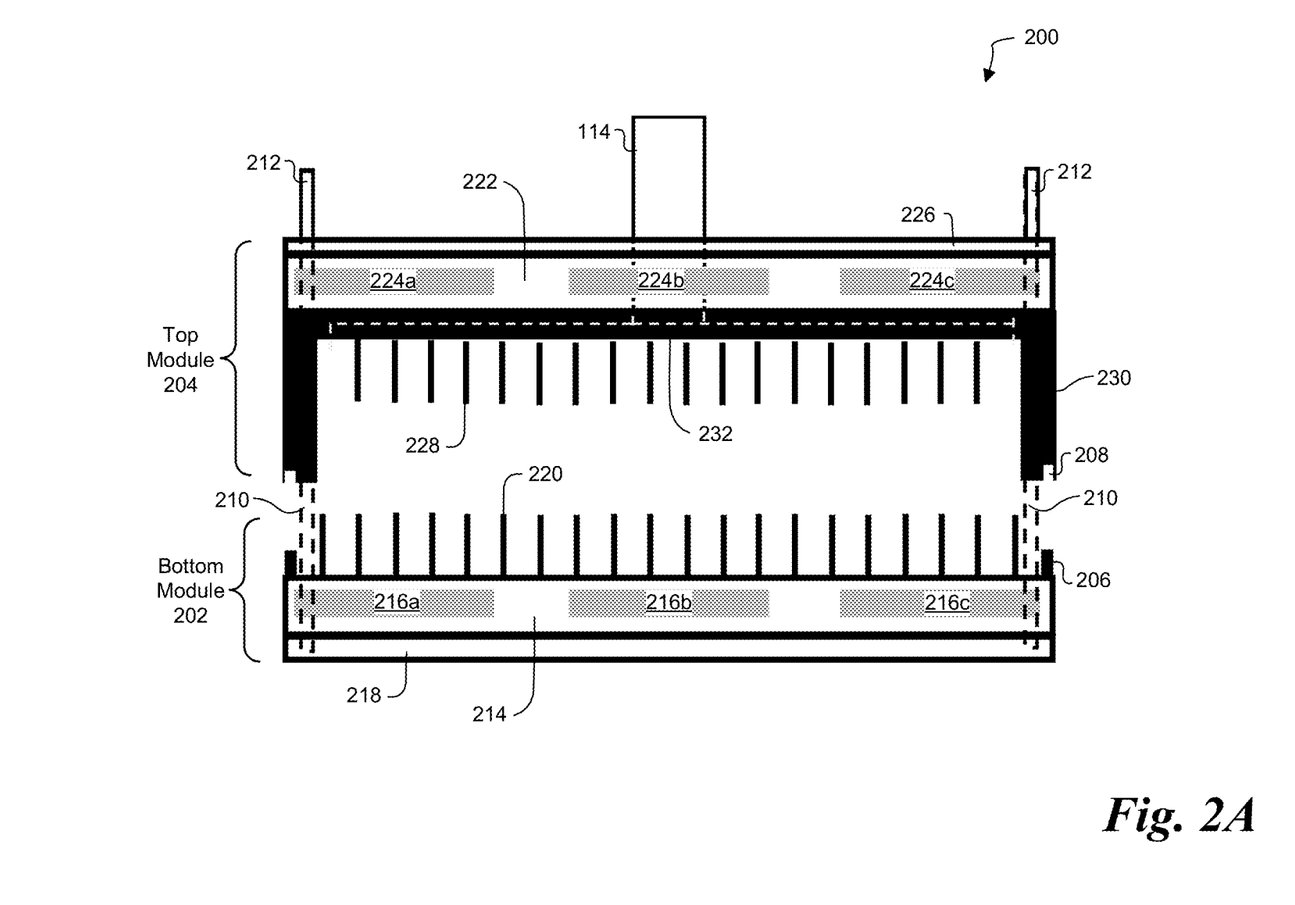
FIG. 2A is an exploded view, FIG. 2B an assembled view.
Figure 2B:
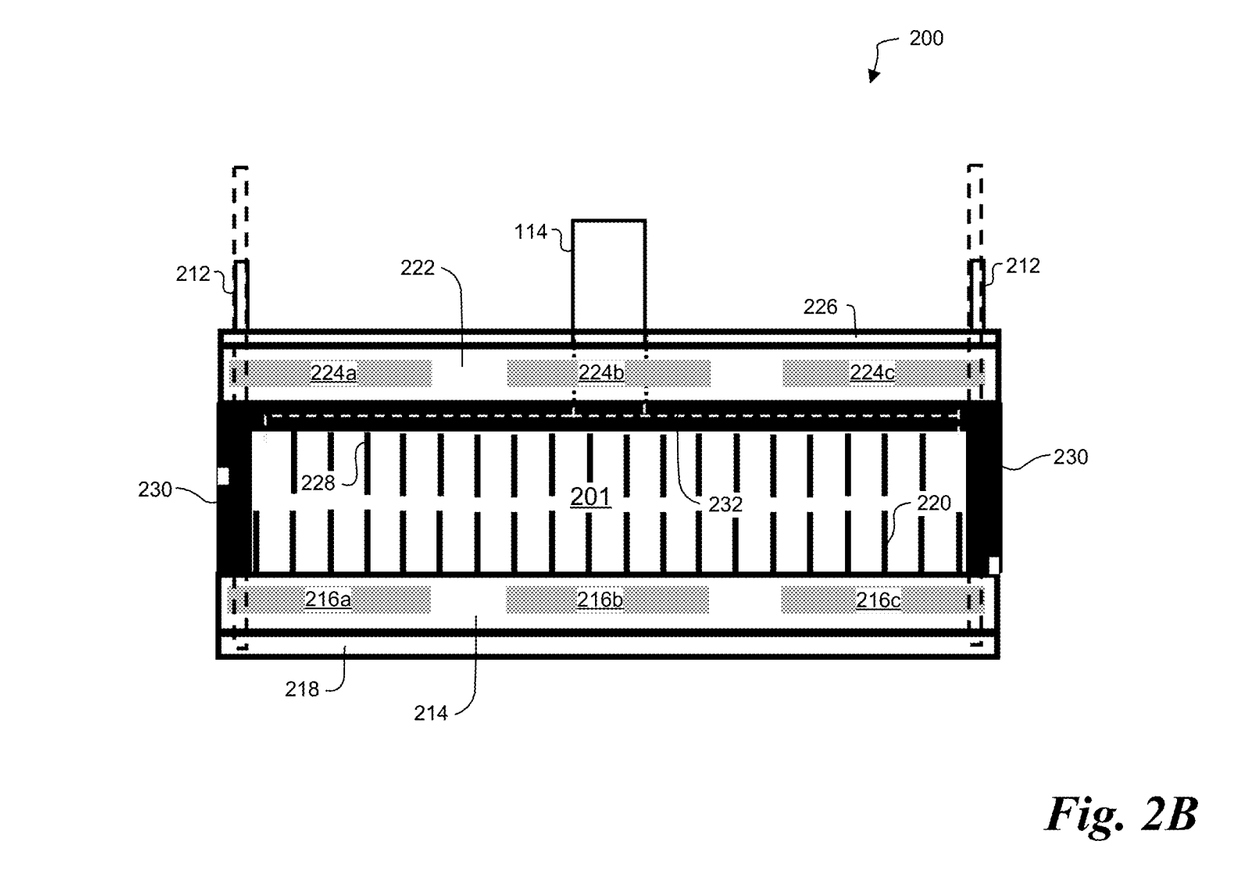

FIGS. 2A-2B together illustrate an embodiment of a heating plate 200 that can be used to heat working fluid flowing through the heating loop in systems 150 and 350. FIG. 2A is an exploded view, FIG. 2B an assembled view. Heating plate 200 includes a bottom module 202 and a top module 204. Bottom module 202 includes a thermally conductive base 214 within which are positioned one or more power resistors 216. The illustrated embodiment has three power resistors 216a-216c uniformly distributed within base 214, but other embodiment can have more or less power resistors than shown and the power resistors need not be uniformly distributed. Electrical connections (not shown) are provided so that electric power can be delivered to power resistors 216. An insulating cover 218 is coupled to the exterior side of base 214 to slow or prevent heat transfer from the base to the exterior. A plurality of heat fins 220 project from the interior side of base 214 and are thermally coupled to the base so that heat generated by power resistors 216 can flow into fins 220 by conduction.

Top module 204 includes a thermally conductive base 222 within which are positioned one or more power resistors 224. The illustrated embodiment has three power resistors 224a-224c uniformly distributed within base 222, but other embodiments can have more or less power resistors than shown, the power resistors need not be uniformly distributed, and the number of power resistors 224 need not be the same as the number of power resistors 216. Electrical connections (not shown) are provided so that electric power can be delivered to power resistors 216. An insulating cover 226 is coupled to the exterior side of base 222 to slow or prevent heat transfer from the base to the exterior. A plurality of heat fins 228 project from the interior side of base 222 and are thermally coupled to the base so that heat generated by power resistors 224 can flow into fins 228 by conduction.

Top module 204 also includes a sidewall 230 that extends around the perimeter of the interior side of base 222, so that when bottom module 202 and top module 204 are assembled a sealed interior cavity 201 is created (see FIG. 2B). A fluid port 114 includes an inlet and an outlet that are fluidly coupled to the sealed interior cavity through channels 232 in the top module to allow entry and exit of working fluid.

Top module 204 mates with bottom module 202 to form a sealed interior cavity 201 within the heating plate. Interior cavity 201 is bounded by sidewall 230 and bases 214 and 222. When assembled, the ends of fins 220 in bottom module 202 abut or nearly abut the ends of corresponding fins 228 of the top module, so that fluid channels are created within sealed interior cavity 201. Mounting holes 210 extend through the thickness of insulating cover 226, base 222, and sidewall 230, and also extend at least partially through the thickness of base 214. Top module 204 is fixed to bottom module 202 by fasteners 212, which can be mounting screws in one embodiment, that fit into mounting holes 210. To seal interior cavity 201, sealing pad 206 around the perimeter of the interior side of base 214 engages corresponding notch 208 in sidewall 230.

In operation of heating plate 200, a working fluid flows through fluid port 114 into sealed interior cavity 201, where it flows through the channels created by fins 220 and 228. At the same time, electrical power is provided to power resistors 216 and 224. The power resistors are thermally coupled to fins 220 and 228, so that the fins are heated by the power resistors through conduction. As working fluid flows through the channels, heat is transferred to it by bases 214 and 222 and fins 220 and 228, thus heating the working fluid. The heated working fluid then exits heating plate 200 through fluid port 114.

Figure 3A:
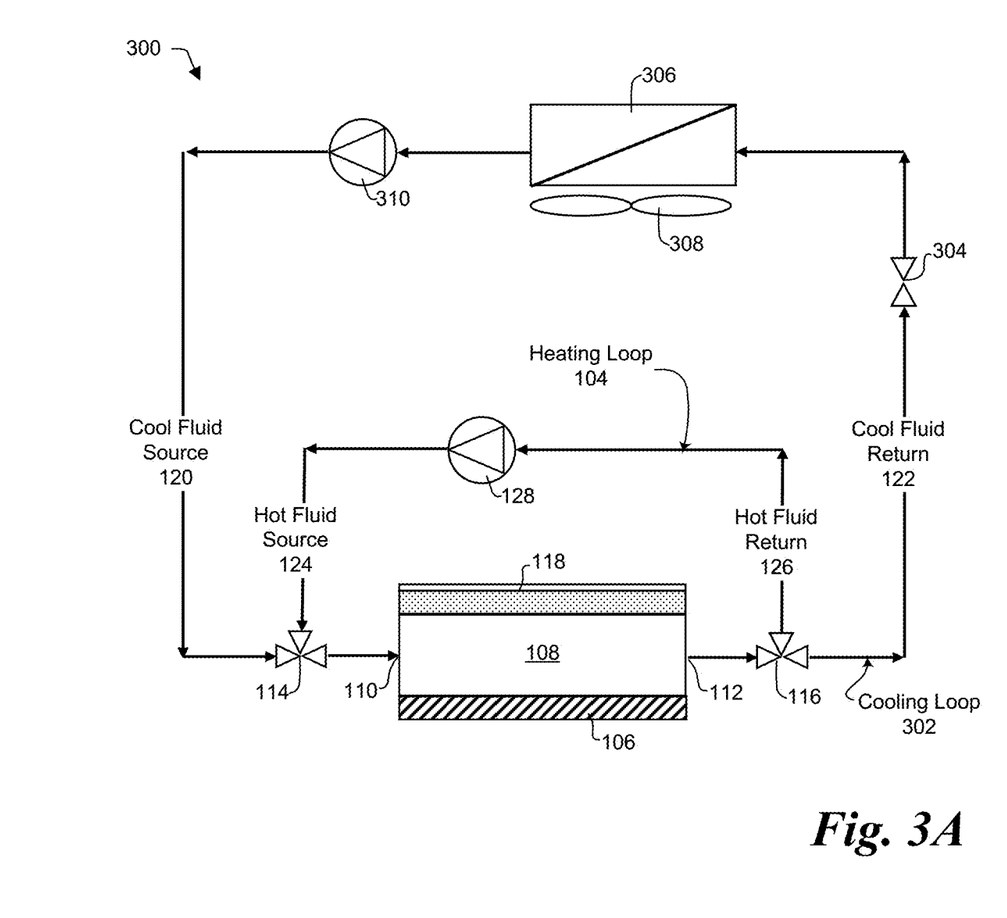
FIGS. 3A-3B are schematics of embodiments of temperature control systems with closed-loop cooling.

FIG. 3A illustrates an embodiment of a temperature control system 300. System 300 is in most respects similar to system 100: the primary difference between systems 300 and 100 is in the cooling loop, which is an open loop in system 100 but a closed loop in system 300.

System 300 includes a temperature control plate 108 thermally coupled to heat-generating electronics 106. Temperature control plate 108 includes a fluid inlet 110 and a fluid outlet 112, with an inlet control 114 fluidly coupled to fluid inlet 110 and an outlet control 116 fluidly coupled to outlet 112. Temperature control plate 108 allows heat provided by the heat-generating electronic components 106 themselves to heat the working fluid flowing through it. Temperature control plate 108 also includes heater 118 to heat the working fluid.

Heating loop 104 is substantially the same in system 300 as it is in system 100: it is a closed loop fluidly coupled to temperature control plate 108. A hot fluid source 124 is fluidly coupled to inlet control 114 and a hot fluid return 126 is fluidly coupled to outlet control 116, so that the inlet and outlet controls regulate the flow of hot working fluid through temperature control plate 108.

Cooling loop 302 in system 300 is different than cooling loop 102 in system 100. In system 300 the cooling loop is a closed loop instead of an open loop. As a result, cooling loop 302 includes additional components not found in cooling loop 102. As in system 100, cool fluid source 120 is coupled to inlet control 114 and cool fluid return 122 is coupled to outlet control 116. Cool fluid return 122 is coupled to a valve 304 and to the inlet of a heat exchanger 306. In one embodiment heat exchanger 306 can be an air-cooled radiator with or without a fan 308 to force convection through the radiator, but in other embodiments it can be another type of heat exchanger. A pump 310 is coupled to the cooling loop at the outlet of heat exchanger 304 to circulate working fluid through the cooling loop. Although not shown in the figure (but see FIG. 1A), system 300 can include the same temperature sensors T1-T3 in the same locations as in system 100.

Despite their differences, system 300 and 100 operate similarly and have the same modes of operation. By selectively configuring inlet control 114 and outlet control 116, cool working fluid, hot working fluid, or a mixture of the two, can be directed through temperature control plate 108 to regulate the temperature of electronics 106.

Figure 3B:
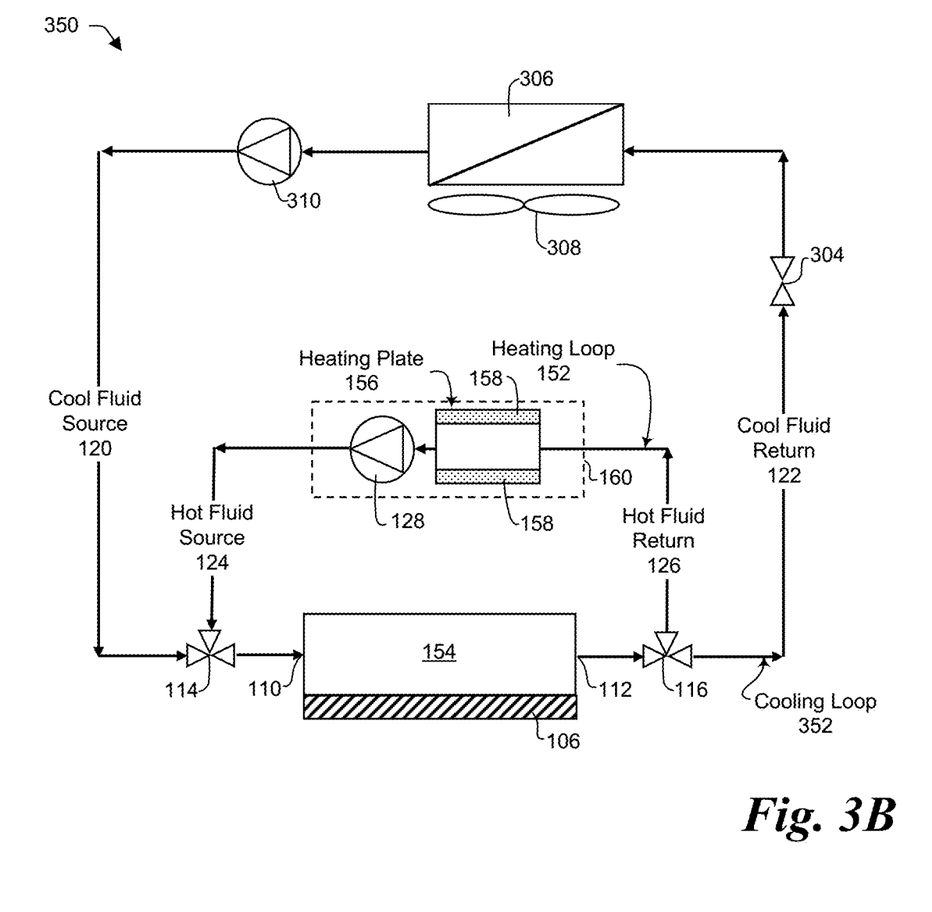

FIG. 3B illustrates another embodiment of a temperature control system 350. System 350 is in most respects similar to system 150: the primary difference between systems 350 and 150 is in the cooling loop.

System 350 includes a cold plate 154 thermally coupled to heat-generating electronics 106. Cold plate 154 includes a fluid inlet 110 and a fluid outlet 112, with an inlet control 114 fluidly coupled to fluid inlet 110 and an outlet control 116 fluidly coupled to outlet 112. Cold plate 154 allows heat provided by the heat-generating electronic components 106 themselves to heat the working fluid flowing through it.

Heating loop 104 is substantially the same in system 350 as it is in system 150: it is a closed loop fluidly coupled to cold plate 154. A hot fluid source 124 is fluidly coupled to inlet control 114 and a hot fluid return 126 is fluidly coupled to outlet control 116, so that the inlet and outlet controls regulate the flow of not working fluid through cold plate 154. A heating plate 156 and pump 128 are fluidly coupled in the heating loop. In one embodiment, heating plate 156 and pump 128 can be combined into a single unit or module 160 that can be easily coupled and uncoupled from the heating loop, and in which a single power source is needed to power the resistor to generate heat and to power the pump motor.

Cooling loop 352 in system 350 is different than cooling loop 102 in system 150. In system 350 the cooling loop is a closed loop instead of an open loop. As a result, cooling loop 352 includes additional components not found in cooling loop 102. As in system 150, cool fluid source 120 is coupled to inlet control 114 and cool fluid return 122 is coupled to outlet control 116. Cool fluid return 122 is coupled to a valve 304 and to the inlet of a heat exchanger 306. In one embodiment heat exchanger 306 can be an air-cooled radiator with or without a fan 308 to force convection through the radiator, but in other embodiments it can be another type of heat exchanger. A pump 310 is coupled to the cooling loop at the outlet of heat exchanger 304 to circulate working fluid through the cooling loop. Although not shown in the figure (but see FIG. 1B), system 350 can include the same temperature sensors T1-T4 in the same locations as in system 150.

Despite their differences, system 350 and 150 operate similarly and have the same modes of operation. By selectively configuring inlet control 114 and outlet control 116, cool working fluid, hot working fluid, or a mixture of the two, can be directed through cold plate 154 to regulate the temperature of electronics 106.

Figure 4A:
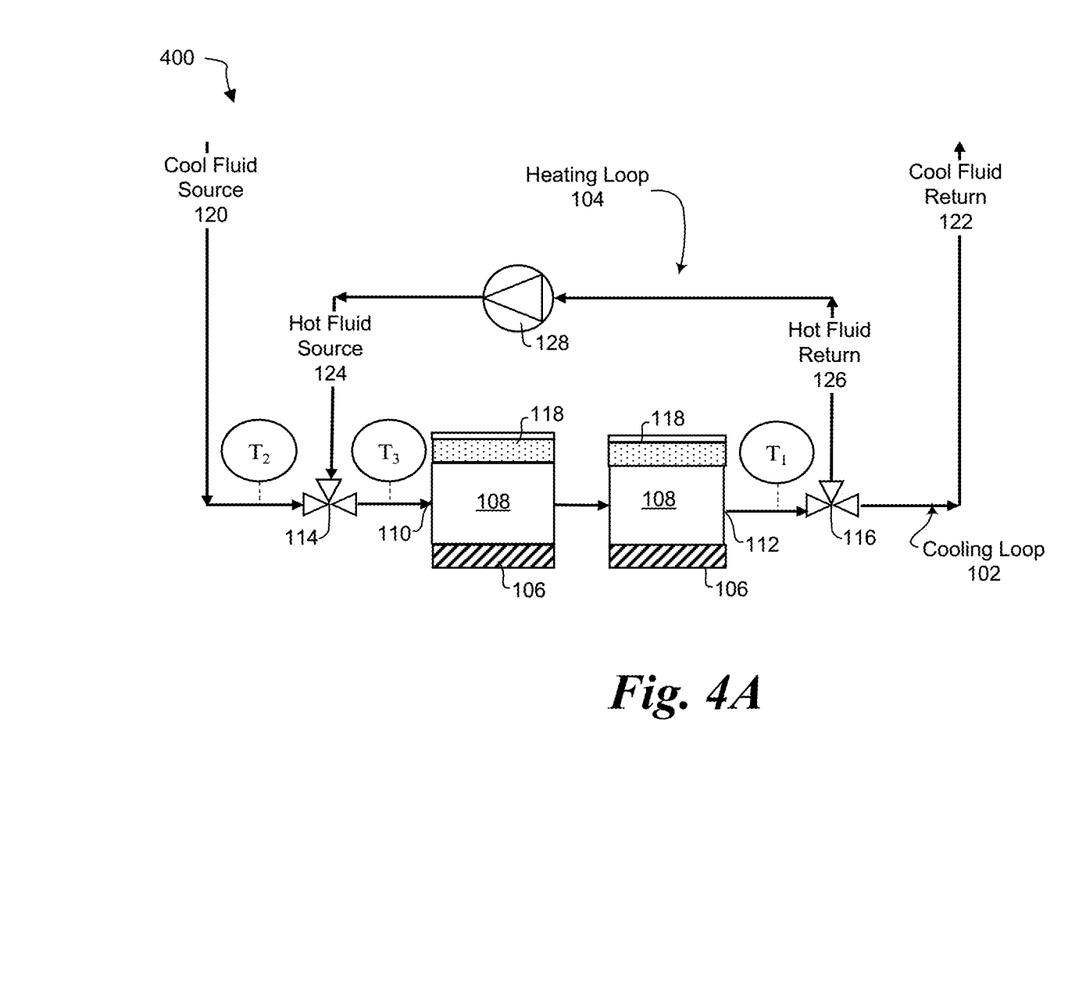
FIGS. 4A-4C are schematics of other embodiments of a temperature control system with open-loop cooling.
Figure 4B:
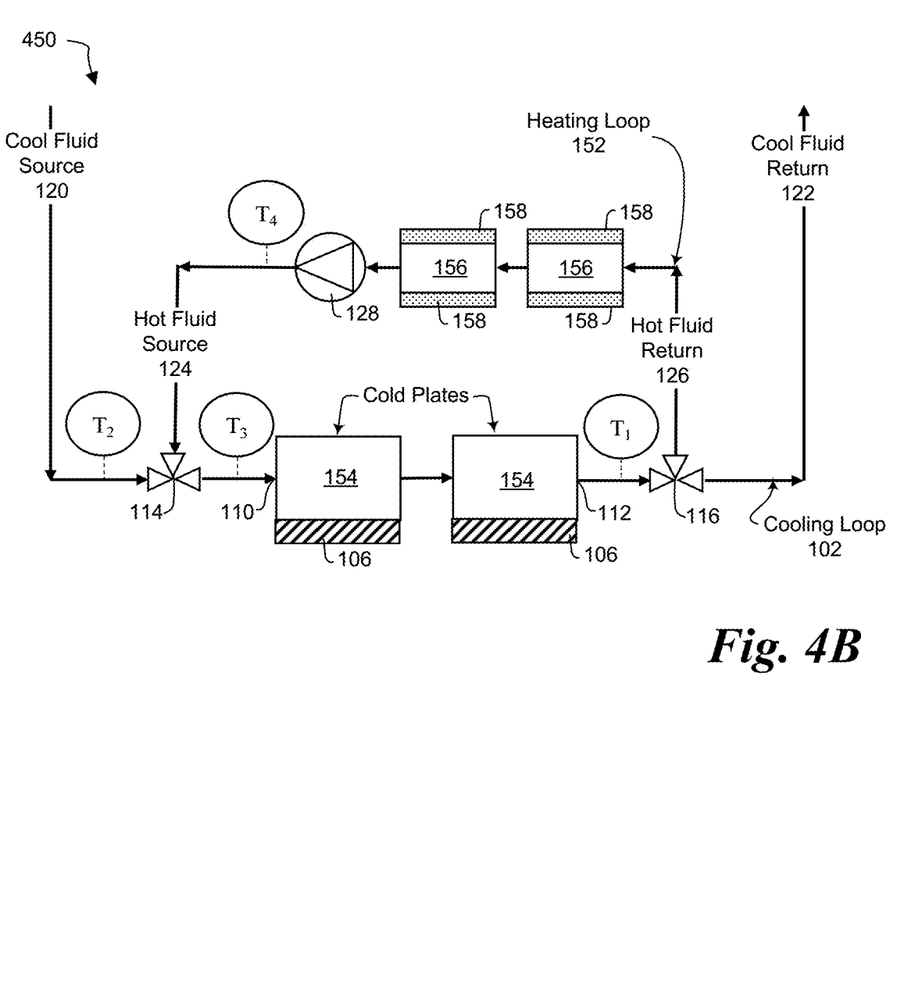
Figure 4C:
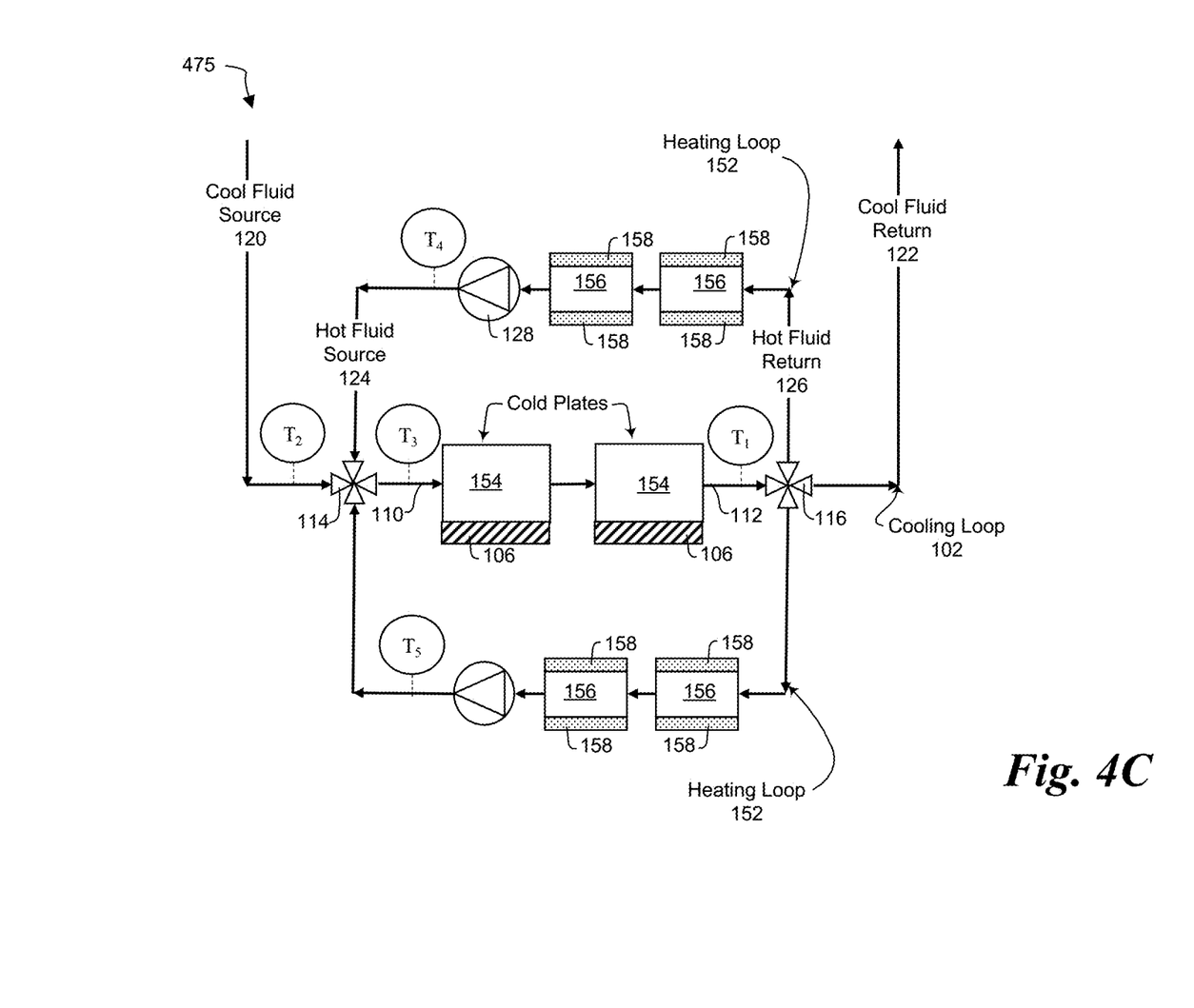

FIGS. 4A-4C illustrate other embodiments of systems 100 and 150 with open-loop cooling, but these embodiments can also be implemented in systems 300 and 350, which have closed cooling loop.

FIG. 4A illustrates a system 400 that is in most respects similar to system 100. The primary different between systems 400 and 100 is that system 400 includes multiple temperature control plates 108 instead of only one. In the illustrated embodiment system 400 includes two identical temperature control plates 108, but in other embodiments it can include more temperature control plates than shown and the temperature control plates need not be identical. The illustrated embodiment also shows each temperature control plate 108 thermally coupled to separate electronic components 106, but in other embodiments multiple temperature control plates 108 can be thermally coupled to the same electronic components 106.

FIG. 4B illustrates a system 450 that is in most respects similar to system 150. The primary different between systems 450 and 150 is that system 400 includes multiple cold plates 154 in cooling loop 102 instead of only one, and also includes multiple heating plates 156 in heating loop 152 instead of only one. In the illustrated embodiment cooling loop 102 includes two identical cold plates 154, but in other embodiments it can have more or less cold plates than shown and the cold plates need not be identical. Similarly, in the illustrated embodiment heating loop 152 includes two identical heating plates 156, but in other embodiments it can include more or less heating plates than shown and the heating plates need not be identical. The illustrated embodiment also shows each cold plate 154 thermally coupled to separate electronic components 106, but in other embodiments multiple cold plates 154 can be thermally coupled to the same electronic components 106. In the illustrated embodiment both heating plates 156 are serviced by a single pump 128, but in other embodiments each heating plate 156 can be services by its own pump 128, for instance if there are multiple modules 160 in the loop (see FIG. 3B).

FIG. 4C illustrates a system 475 that is in most respects similar to system 450. The primary different between systems 475 and 450 is that system 475 includes multiple heating loops 152. To accommodate multiple heating loops, in one embodiment inlet control 114 and outlet control 116 can be four-way valves, but in other embodiments the inlet and outlet controls could be something else, such as combinations of valves, and the inlet and outlet controls need not be identical. As in system 450, in system 475 the cooling loop includes multiple cold plates 154 instead of only one, and the heating loop includes multiple heating plates 156 instead of only one. In the illustrated embodiment of system 475 the cooling loop includes two identical cold plates 154, but in other embodiments it can have more or less cold plates than shown and the cold plates need not be identical. Similarly, the illustrated embodiment of system 450 each heating loop 152 includes two identical heating plates 156, but in other embodiments each heating loop can include more or less heating plates than shown, the number of heating plates in each loop need not be the same, and the heating plates in each loop need not be identical. The illustrated embodiment also shows each cold plate 154 thermally coupled to separate electronic components 106, but in other embodiments multiple cold plates 154 can be thermally coupled to the same electronic components 106. In the illustrated embodiment both heating plates 156 are serviced by a single pump 128, but in other embodiments each heating plate 156 can be services by its own pump 128, for instance if there are multiple modules 160 in the loop (see FIG. 3B).

Other cooling system embodiments of are possible besides the ones described above. For instance:

The heating plate design can be modified and customized to achieve a similar result.

The system can be customized to achieve a similar function.

The full heating loop can be packaged as a single module.

The above description of embodiments is not intended to be exhaustive or to limit the invention to the described forms. Specific embodiments of, and examples for, the invention are described herein for illustrative purposes, but various modifications are possible.

What is claimed is:

1. An apparatus comprising:
    a cooling loop to circulate a working fluid, the cooling loop including:
        at least one temperature control plate having a fluid inlet and a fluid outlet, the temperature control plate adapted to be thermally coupled to one or more heat-generating electronic components,
        an inlet control fluidly coupled to the fluid inlet of the at least one temperature control plate and an outlet control fluidly coupled to the fluid outlet of the at least one temperature control plate, and
        a cooling fluid source fluidly coupled the inlet control and a cooling fluid return fluidly coupled to the outlet control; and at least one heating loop to circulate the working fluid, the
at least one heating loop being shorter than the cooling
loop and including:
a heating fluid source fluidly coupled the inlet control
and a heating fluid return fluidly coupled to the outlet
control, and
a pump to circulate heating fluid through at least the
heating fluid source, the temperature control plate,
and the heating fluid return.

2. The apparatus of claim 1 wherein the inlet control, the outlet control, or both, are three-way valves.

3. The apparatus of claim 1 wherein the temperature control plate includes a heater to heat fluid circulating through the temperature control plate.

4. The apparatus of claim 1 wherein the temperature control plate is a cooling plate and the heating loop further includes at least one heating plate separate from the cooling plate to heat the working fluid circulating through the heating loop.

5. The apparatus of claim 4 wherein:
the cooling loop includes two or more cooling plates;
the heating loop includes two or more heating plates; or
the cooling loop includes two or more cooling plates and the heating loop includes two or more heating plates.

6. The apparatus of claim 4 wherein the heating plate comprises:
a first module comprising:
a thermally conductive first base having at least one heater positioned therein, and
a plurality of first fins thermally coupled to an interior side of the first base and projecting therefrom;
a second module comprising:
a thermally conductive second base having at least one heater positioned therein,
a sidewall around the perimeter of an interior side of the second base,
a plurality of second fins thermally coupled to the interior side of the second base and projecting therefrom, and
a fluid port on an exterior side of the second base, the fluid port including an inlet and an outlet;
wherein the first module is joined to the second module so that the first base, the second base, and the sidewall form a sealed interior cavity, wherein the sealed interior cavity is fluidly coupled to the fluid port so that a working fluid can enter and exit the sealed interior cavity through the fluid port.

7. The apparatus of claim 1 wherein the cooling loop is an open loop.

8. An apparatus comprising:
a cooling loop to circulate a working fluid, the cooling loop including:
at least one temperature control plate having a fluid inlet and a fluid outlet, the temperature control plate adapted to be thermally coupled to one or more heat-generating electronic components,
an inlet control fluidly coupled to the fluid inlet of the at least one temperature control plate and an outlet control fluidly coupled to the fluid outlet of the temperature control plate,
a cooling fluid source fluidly coupled the inlet control and a cooling fluid return fluidly coupled to the outlet control, and
a heat exchanger fluidly coupled between the cooling fluid source and the cooling fluid return, wherein the heat exchanger extracts heat from the working fluid received from the cooling fluid return and directs the working fluid into the cooling fluid source; and
at least one heating loop to circulate the working fluid, the at least one heating loop being shorter than the cooling loop and including:
a heating fluid source fluidly coupled the inlet control and a heating fluid return fluidly coupled to the outlet control, and
a pump to circulate heating fluid through at least the heating fluid source, the temperature control plate, and the heating fluid return.

9. The apparatus of claim 8 wherein the inlet control, the outlet control, or both, are three-way valves.

10. The apparatus of claim 8 wherein the temperature control plate includes a heater to heat fluid circulating through the temperature control plate.

11. The apparatus of claim 8 wherein the temperature control plate is a cold plate and the heating loop further includes a heating plate separate from the cooling plate to heat the working fluid circulating through the heating loop.

12. The apparatus of claim 11 wherein:
the cooling loop includes two or more cooling plates;
the heating loop includes two or more heating plates; or
the cooling loop includes two or more cooling plates and the heating loop includes two or more heating plates.

13. The apparatus of claim 11 wherein the heating plate comprises:
a first module comprising:
a thermally conductive first base having at least one heater positioned therein, and
a plurality of first fins thermally coupled to an interior side of the first base and projecting therefrom;
a second module comprising:
a thermally conductive second base having at least one heater positioned therein,
a sidewall around the perimeter of an interior side of the second base,
a plurality of second fins thermally coupled to the interior side of the second base and projecting therefrom, and
a fluid port on an exterior side of the second base, the fluid port including an inlet and an outlet;
wherein the first module is joined to the second module so that the first base, the second base, and the sidewall form a sealed interior cavity, wherein the sealed interior cavity is fluidly coupled to the fluid port so that a working fluid can enter and exit the sealed interior cavity through the fluid port.

14. The apparatus of claim 8 wherein the cooling loop further comprises a pump to circulate working fluid through the cooling loop.

15. The apparatus of claim 8, further comprising a fan to force air convection through the heat exchanger.

* * * * *